United States Patent
Taguchi et al.

[11] Patent Number: 5,847,626
[45] Date of Patent: Dec. 8, 1998

[54] BALANCED-TYPE SURFACE ACOUSTIC WAVE LATTICE FILTER

[75] Inventors: Yutaka Taguchi, Osaka; Kazuo Eda, Nara; Shun-ichi Seki, Hyogo; Keiji Onishi, Osaka, all of Japan

[73] Assignee: Matsushita Electric Industrial Co., Ltd., Osaka, Japan

[21] Appl. No.: 655,049

[22] Filed: May 29, 1996

Related U.S. Application Data

[63] Continuation-in-part of Ser. No. 386,460, Feb. 10, 1995, abandoned.

[30] Foreign Application Priority Data

Feb. 22, 1994 [JP] Japan ................................... 6-024027
Apr. 22, 1996 [JP] Japan ................................... 8-100012

[51] Int. Cl.⁶ .......................... H03H 9/64; H03H 9/52
[52] U.S. Cl. ...................... 333/193; 333/194; 310/313 R
[58] Field of Search ................. 333/193–196, 333/169, 170; 310/313 R, 313 B, 313 C, 313 D

[56] References Cited

U.S. PATENT DOCUMENTS

| | | | |
|---|---|---|---|
| 2,696,591 | 12/1954 | Leroy | 333/169 |
| 4,785,270 | 11/1988 | Kinsman | 333/193 |
| 5,028,893 | 7/1991 | Fliegel | 333/176 |
| 5,093,638 | 3/1992 | Kinsman et al. | 333/195 |
| 5,508,667 | 4/1996 | Kondratiev et al. | 333/194 |

FOREIGN PATENT DOCUMENTS

| | | |
|---|---|---|
| 0 541 284 A1 | 5/1993 | European Pat. Off. . |
| 52-19044 | 2/1977 | Japan . |
| 58-29627 | 6/1983 | Japan . |
| 58-154917 | 9/1983 | Japan . |
| 0 127 810 | 5/1990 | Japan ..................................... 333/193 |
| 3-222512 | 10/1991 | Japan . |
| 406029779 A | 2/1994 | Japan ..................................... 333/193 |

OTHER PUBLICATIONS

1974 Ultrasonics Symposium Proceedings; New York, US: S.C. Tseng et al: SAW Planar Network.

*Primary Examiner*—Robert J. Pascal
*Assistant Examiner*—Barbara Summons
*Attorney, Agent, or Firm*—Morrison & Foerster

[57] ABSTRACT

A balanced-type surface acoustic wave filter is provided which can attain a balanced-type of high frequency circuit without connecting a balance-unbalanced conversion circuit.

A substrate of tantalic acid lithium substrate with 36 degrees rotation, Y cut, and X propagation is used, and aluminium is used for electrode to form resonators. Then, two resonators in a serial arm and two resonators in a parallel arm are connected in the form of symmetry and lattice to form a balanced-type surface acoustic wave filter. In this configuration, antiresonance frequency in the serial arms and resonance frequency in the parallel arms are substantially equal to each other.

7 Claims, 19 Drawing Sheets

BALANCED-TYPE SURFACE ACOUSTIC WAVE LATTICE FILTER

This is a continuation-in-part of Ser. No. 08/386,460, filed Feb. 10, 1995, now abandoned.

FIELD OF THE INVENTION

This invention relates to a balanced-type surface acoustic wave filter used for communication equipment.

BACKGROUND OF THE INVENTION

Recently, a surface acoustic wave element used for filters has been intensively developed. In particular, along with the recent advancements in mobile communications and the tendency towards higher frequency, the development of a surface acoustic wave element, and in particular a surface acoustic wave filter is now of great interest. Conventionally, several methods have been proposed to form filters used for high frequency bands, especially for several 100 MHz, with the use of surface acoustic wave elements. As typical examples of this filter, one type comprises a plurality of surface acoustic wave resonators as disclosed in Published Unexamined Japanese Patent Application Nos. (Tokkai Sho) 52-19044 and (Tokkai Hei) 5-183380. A so-called multi-electrode type filter is disclosed in Published Unexamined Japanese Patent Application No. (Tokkai Sho) 58-154917. Another type, which is disclosed in Published Unexamined Japanese Patent Application No. (Tokkai Hei) 3-222512, is characterized by the steps of positioning surface acoustic wave resonators adjacent to each other and connecting these resonators.

Conventional surface acoustic wave filters were mostly so-called unbalanced-type filters. Basically, the multielectrode type filter can be used both in balanced and unbalanced forms. However, a filter with four terminals usually has one pair of input and output terminals which are connected directly and are used normally as earth terminals, so that the filter was only capable of processing unbalanced signals. On the other hand, high frequency circuits such as an amplifier or a mixer can improve their circuit characteristics when they use balanced signals. However, since a filter which was connected to these circuits, and which was indispensable for high frequency circuits, was not adjusted to balanced circuits, high frequency circuits used for balanced circuits needed to connect a balanced-unbalanced conversion circuit at a part where the filter was connected. This resulted in an increased number of components and higher costs, so that this type of filter was actually used only rarely.

As an example of a conventional balanced-type filter, a surface acoustic wave device is disclosed in Published Examined Japanese Utility Model Application No. (Jikko Sho) 58-29627. This device uses the above-noted multielectrode type filter as a balanced-type filter and is disposed with a balanced-unbalanced conversion device for input and output. Therefore, as already mentioned above, the number of components is increased, so this filter is not generally used. Another example of a balanced-type filter is disclosed in Published Examined Japanese Patent Application No. (Tokkai Hei) 1-208010, in which surface acoustic wave resonators are connected to a lattice type circuit. In this case, however, the resonator is formed as a two-port resonator, and furthermore, this filter has no means to control resonance frequency and antiresonance frequency.

SUMMARY OF THE INVENTION

An object of this invention is to solve the above-mentioned problems in the conventional techniques by providing a balanced-type surface acoustic wave filter which can attain a balanced-type high frequency circuit without connecting a balance-unbalanced conversion circuit.

In order to accomplish these and other advantages, a first balanced-type surface acoustic wave filter of this invention comprises a plurality of symmetrical and latticed circuits connected in series, each of the symmetrical and latticed circuits comprises four arms which are connected, where two of the four arms serve as serial arms and the other two arms serve as latticed arms; four surface acoustic wave resonators are disposed, whereby the resonators are respectively arranged in the serial arms and the latticed arms; and a means for adjusting resonant frequencies in the latticed arms and the serial arms to satisfy at least one of the following conditions; (i) an antiresonance frequency in the latticed arms and a resonance frequency in the serial arms are substantially equal to each other, and (ii) a resonance frequency in the latticed arms and an antiresonance frequency in the serial arms are substantially equal to each other. According to the first structure of the balanced-type surface acoustic wave filter of this invention, a balanced-type surface acoustic wave filter having excellent characteristics can be obtained. In addition, since a balanced-type high frequency circuit can be attained without using a balance-unbalanced conversion circuit, the number of components and costs can be reduced. Furthermore, no intersection of wirings is formed on the substrate surface.

It is preferable that the balanced-type surface acoustic wave filter further comprises a plurality of connectors for connecting each of four surface acoustic wave resonators, wherein each of the connectors has a substantially same amount of impedance. According to the preferred structure, a balanced-type surface acoustic wave filter having excellent characteristics can be obtained regardless of how the surface acoustic wave resonator is designed. Furthermore, it is preferable that each of the connectors comprises at least one of (i) a connecting electrode formed on the surface of a substrate on which said four surface acoustic wave resonators are formed, and (ii) a wire used for connecting to an external circuit.

It is preferable that the balanced-type surface acoustic wave filter further comprises a plurality of first connectors for connecting each of the surface acoustic wave resonators located in the latticed arm; and a plurality of second connectors for connecting each of the surface acoustic wave resonators located in the serial arm, wherein an impedance at the first connectors differs from an impedance at the second connectors. According to the preferred structure, even if the ratio of the equivalent parallel capacity between the surface acoustic wave resonator in a serial arm and the surface acoustic wave resonator in a parallel arm is changed from 1-to-1, since at least one of the following conditions is satisfied; (i) an antiresonance frequency in the latticed arms and a resonance frequency in the serial arms are substantially equal to each other, and (ii) a resonance frequency in the latticed arms and an antiresonance frequency in the serial arms are substantially equal to each other, a balanced-type surface acoustic wave filter having excellent characteristics can be obtained. Furthermore, it is preferable that each of the first and second connectors comprises at least one of (i) a connecting electrode formed on the surface of a substrate on which the four surface acoustic wave resonators are formed, and (ii) a wire used for connecting to an external circuit.

A second balanced-type surface acoustic wave filter of this invention comprises a plurality of symmetrical and latticed circuits connected in series, wherein each of the symmetrical and latticed circuits comprises first and second surface acoustic wave resonators, wherein an antiresonance frequency in the first surface acoustic wave resonators and a resonance frequency in the second surface acoustic wave resonators are substantially equal to each other; and an equivalent parallel capacity of the first surface acoustic wave resonators is smaller than an equivalent parallel capacity of the second surface acoustic wave resonators, and the symmetrical and latticed circuits have different ratio in terms of equivalent parallel capacities of the first surface acoustic wave resonators to the second surface acoustic wave resonators. According to the second structure of the balance-type surface acoustic wave filter of this invention, attenuation poles appear in the vicinity of the pass band and away from the pass band. As a result, a balanced-type surface acoustic wave filter suitable to a balanced-type high frequency circuit where the characteristics of damping the frequency bands both in the vicinity of the pass band and away from the pass band are required, can be obtained.

A third balanced-type surface acoustic wave filter of this invention comprises a symmetrical and latticed circuit, the symmetrical and latticed circuit comprises first and second surface acoustic wave resonators, wherein an antiresonance frequency in the first surface acoustic wave resonators and a resonance frequency in the second surface acoustic wave resonators are substantially equal to each other; an equivalent parallel capacity of the first surface acoustic wave resonators is smaller than an equivalent parallel capacity of the second surface acoustic wave resonators; and a geometric mean of the equivalent parallel capacity of the first surface acoustic wave resonators and the equivalent parallel capacity of the second surface acoustic wave resonators is C, an input-output impedance of the symmetrical and latticed circuit is Z, a passing center frequency of the symmetrical and latticed circuit is F, a correction factor is K, and an equation $ZK=\frac{1}{2}\pi FC$ is satisfied where $0.6 \leq K \leq 1.8$. According to the third structure of the balanced-type surface acoustic wave filter of this invention, ripples in the pass band can be maintained at a low level, and signal reflection, deterioration of characteristics and so on which are generated by difference between the input-output impedance of a balanced-type surface acoustic wave filter and the input-output impedance of a high frequency circuit, can be suppressed. As a result, since input-output impedance of a balanced-type surface acoustic wave filter can be changed appropriately with adoption of a balanced-type circuit, the balanced-type surface acoustic wave filter suitable to a balance-type high frequency circuit can be obtained.

It is preferable that the balanced-type surface acoustic wave filter further comprises a plurality of the symmetrical and latticed circuits connected in series, whereby the symmetrical and latticed circuits have different ratio in terms of equivalent parallel capacities of the first surface acoustic wave resonators to said second surface acoustic wave resonators. According to the preferred structure, a balanced-type surface acoustic wave filter having a high attenuation over wide-ranging frequencies can be obtained.

DETAIL DESCRIPTION OF THIS INVENTION

This invention will be explained in detail with reference to the attached figures and the following examples. The examples are illustrative and should not be construed as limiting the invention in any way.

EXAMPLE 1

Figure 1:
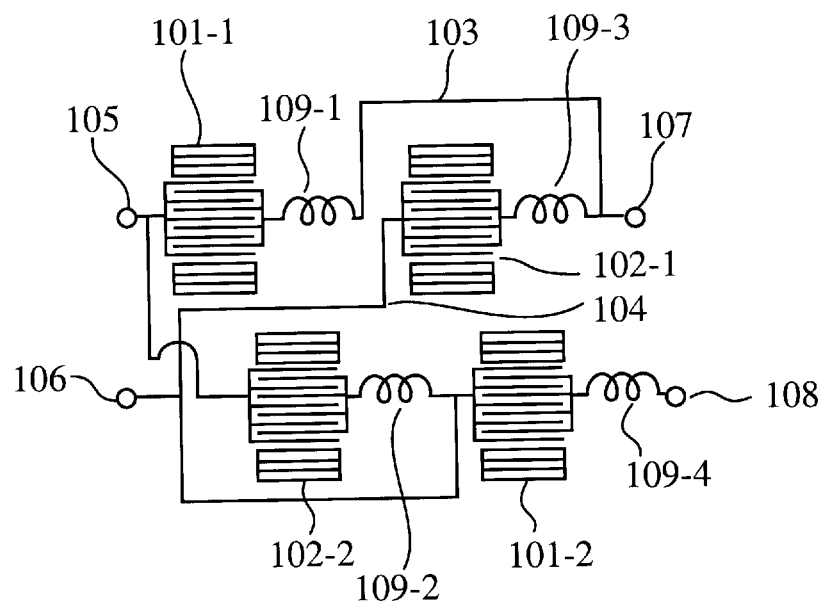
FIG. 1 is a schematic view of a balanced-type surface acoustic wave filter in a first embodiment of this invention.
Figure 2:
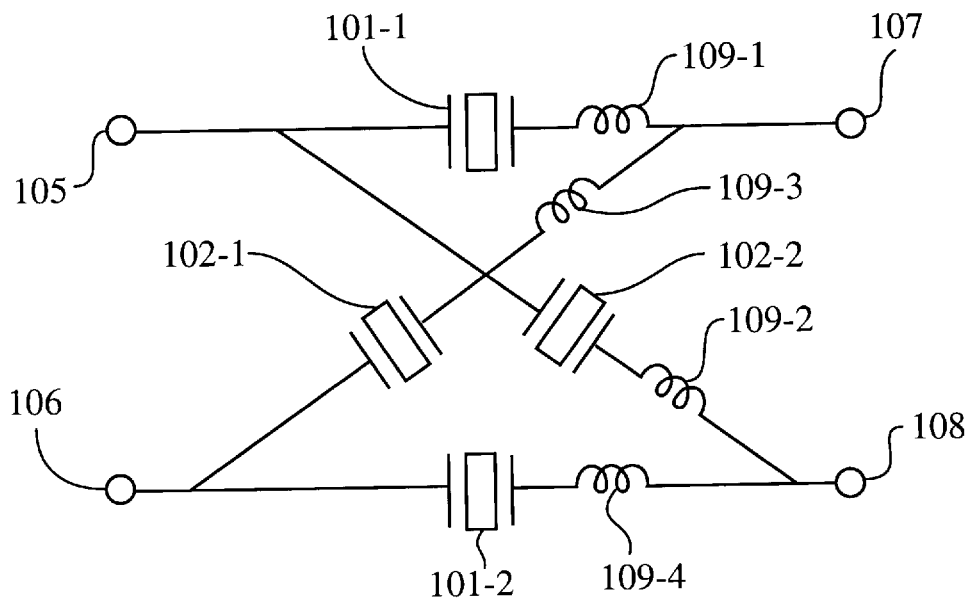
FIG. 2 is a view of an equivalent circuit in the balance-type surface acoustic wave filter shown in FIG. 1.

First, a first embodiment of this invention will be explained. FIG. 1 is a schematic view of a balanced-type surface acoustic wave filter in a first embodiment of this invention, and FIG. 2 is a view of an equivalent circuit of the balanced-type surface acoustic wave filter shown in FIG. 1. A circuit connected in a way shown in FIG. 2 is generally called a symmetrical and latticed circuit.

A substrate of tantalic acid lithium (LiTaO$_3$) with 36 degrees rotation, Y cut, and X propagation was used, and aluminium was used for the electrodes to form resonators 101s and 102s. Then, as shown in FIGS. 1 and 2, two resonators 101-1 and 101-2 in the serial arm and two resonators 102-1 and 102-2 in the parallel arm are connected in the form of symmetry and lattice to form a balance-type surface acoustic wave filter. In FIG. 1, reference numerals 103 and 104 represent connection parts, or connectors, connecting each resonator, and connecting electrodes formed on the substrate surface are used for the connection parts. In FIGS. 1 and 2, 109-1, 109-2, 109-3 and 109-4 represent inductors which are connected serially to the resonators 101-1, 102-2, 102-1 and 101-2, respectively. 105 and 106 represent input terminals, and 107 and 108 represent output terminals. Since connection wires cross on the substrate surface in this embodiment, the input terminal 105 was connected when wire bonding was conducted. Semiconductor techniques can be used for crossing on the substrate surface. Here, a number of electrode pairs and a number of reflector pairs are determined by the characteristics of a piezoelectric substrate. In this embodiment, the number of both electrode pairs and reflector pairs are actually about 100, but to simplify the description, the number of electrode pairs and reflector pairs are reduced in this figure.

Figure 3:
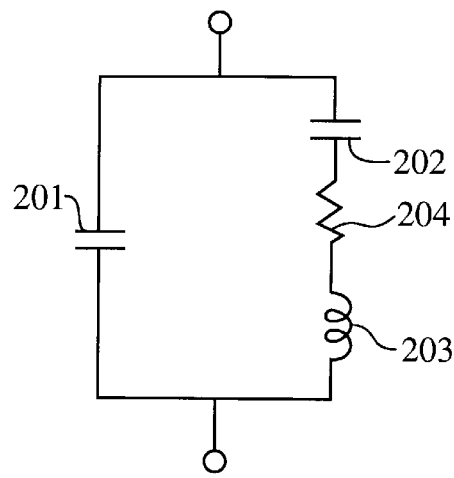
FIG. 3 is a view showing an equivalent circuit of the resonators used for the balanced-type surface acoustic wave filter shown in FIG.1.
Figure 4:
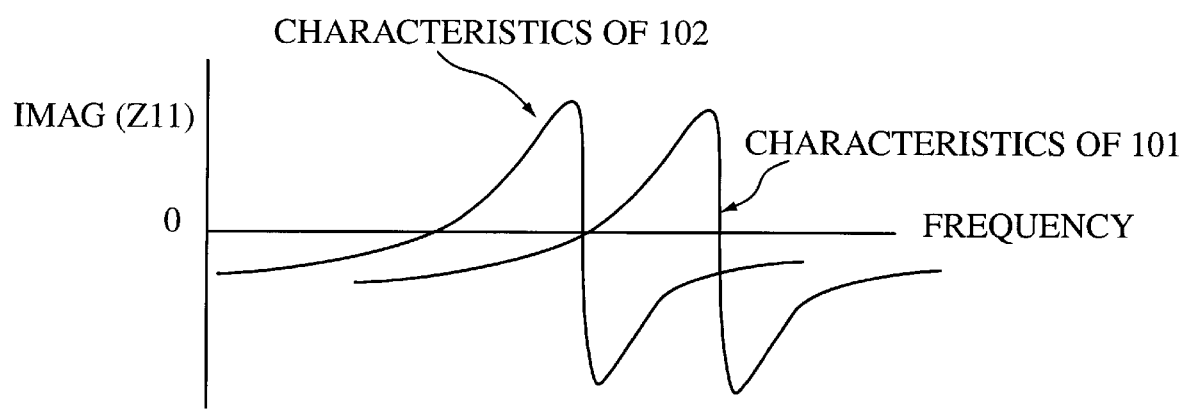
FIG. 4 is a graph showing frequency characteristics of the resonators used for the balanced-type surface acoustic wave filter shown in FIG. 1.

In the above-noted balanced-type surface acoustic wave filter, important factors that determine filter characteristics are resonance frequency and antiresonance frequency of each resonator, and the equivalent parallel capacity of each resonator. FIG. 3 shows an equivalent circuit, wherein 201 represents parallel capacity, 202 represents serial capacity, 203 represents a serial inductor, and 204 represents resonance resistance. In this case, the equivalent parallel capacity refers to the parallel capacity 201 of FIG. 3. Here, the ratio of equivalent capacity between the resonator 101 in the serial arm and the resonator 102 in the parallel arm is approximately 1-to-1, so that the antiresonance frequency in the latticed arms (Here, a latticed arm is the same as a parallel arm) and the resonance frequency in the serial arms correspond approximately to each other in substance. Frequency characteristics of the resonators 101 and 102 are shown in FIG. 4. As shown in FIG. 4, the resonance frequency of the resonator 102 in the parallel arm is lower than the resonance frequency of the resonator 101 in the serial arm.

Figure 5:
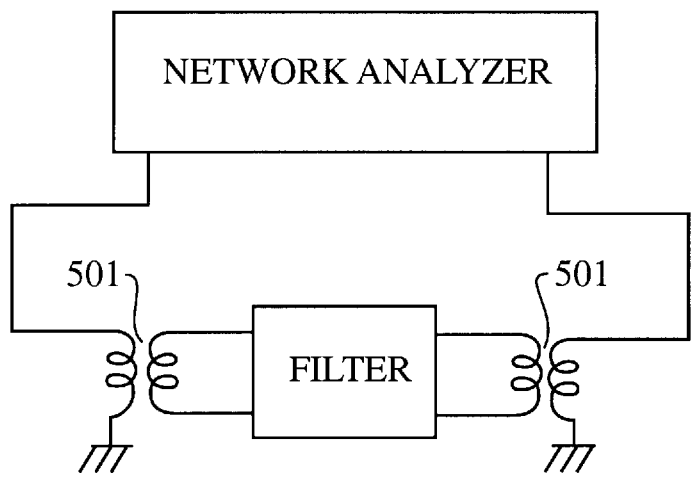
FIG. 5 is a schematic view showing a circuit for measuring filter characteristics.
Figure 6:
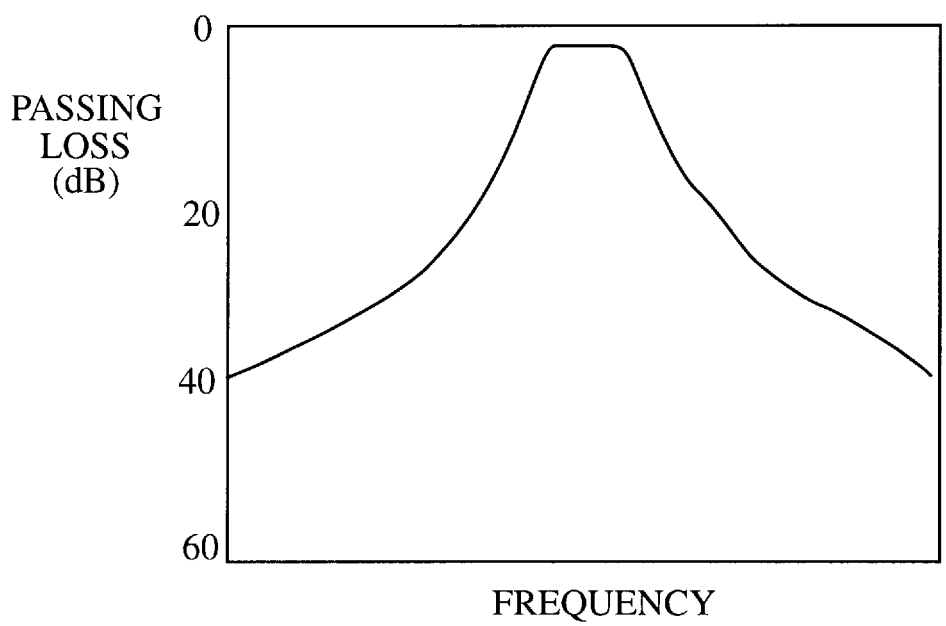
FIG. 6 is a graph showing frequency characteristics of the balanced-type surface acoustic wave filter shown in FIG. 1.

The above-mentioned balanced-type surface acoustic wave filter was converted to an unbalanced-type with the use of a circuit shown in FIG. 5, and the characteristics were measured. In FIG. 5, 501 represents a balun for balanced-unbalanced conversion. The reason for converting this balanced-type surface acoustic wave filter to an unbalanced-type is that the measuring equipment used here is for measurement of unbalanced circuits. The measurement results are shown in FIG. 6. As shown in FIG. 6, it was confirmed that a balanced-type surface acoustic wave filter constructed in accordance with the present invention has excellent frequency characteristics.

EXAMPLE 2

Figure 7:
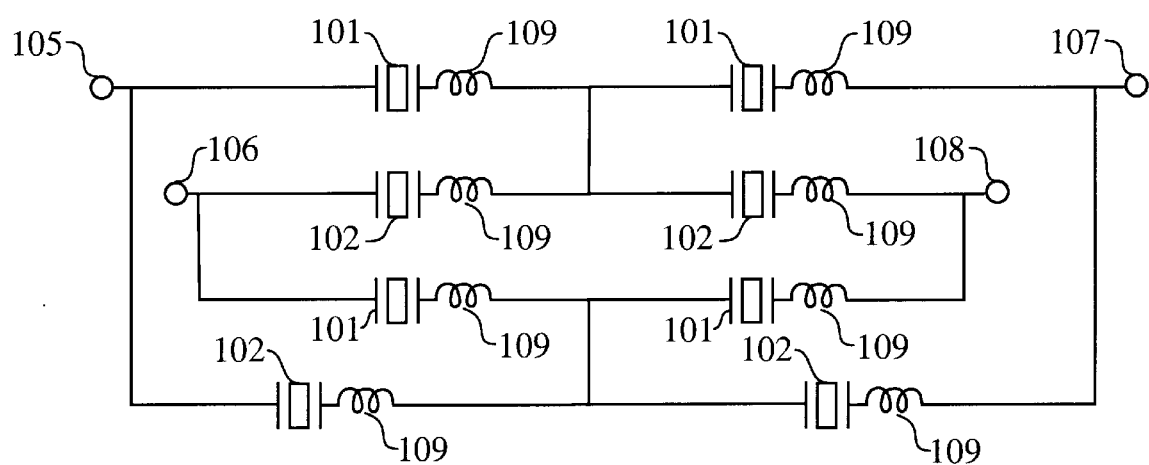
FIG. 7 is a schematic view of a balanced-type surface acoustic wave filter in a second embodiment of this invention.
Figure 8:
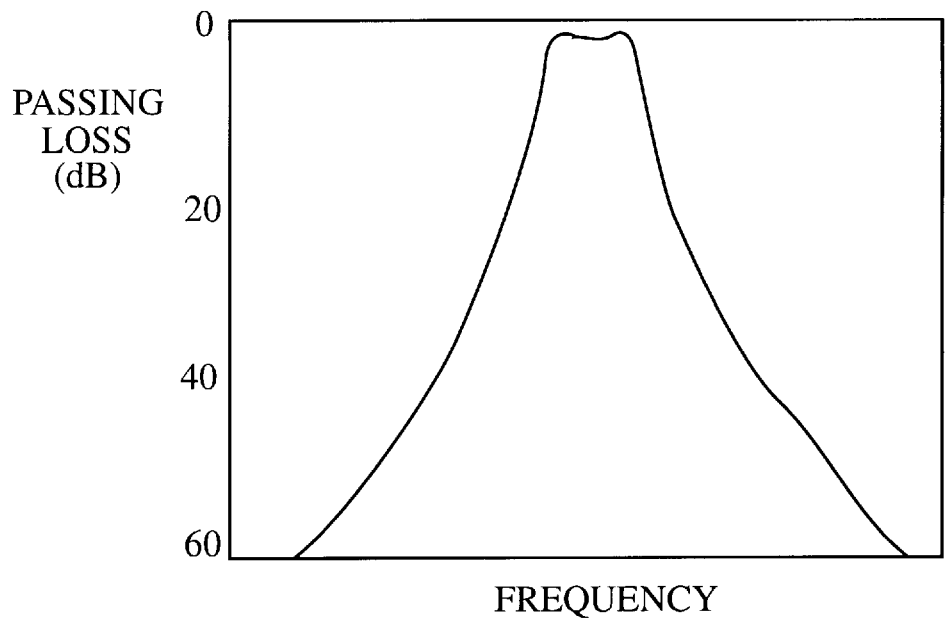
FIG. 8 is a graph showing frequency characteristics of the balanced-type surface acoustic wave filter shown in FIG. 7.

Next, a second embodiment of this invention will be explained. FIG. 7 is a schematic view of the second embodiment of a balanced-type surface acoustic wave filter of this invention. In this embodiment, the structure shown in the first embodiment was connected in a two-stage arrangement, which may be used when it is difficult to obtain sufficient out-of-band rejection with a one-stage arrangement. In this way, when the filter is connected in a two-stage arrangement, there is no part where wirings cross each other on the substrate surface, so that it is considered advantageous that wire bonding can be facilitated. Also in this case, as shown in FIG. 8, a balance-type surface acoustic wave filter having sufficiently high out-of-band rejection could be attained, when compared with the first embodiment with one-stage (cf. FIG. 6).

EXAMPLE 3

Next, a third embodiment of this invention will be explained. In the first and second embodiments, wires for the connection of resonators or wirings were not particularly given special consideration. As a result, depending on the position or the design of the resonator, an inductor component was inserted serially in the resonator. Thus, since the amount of this inductor is different in each resonator, the resonance frequency could be changed, thereby deteriorating the filter characteristics in some cases. By referring to the equivalent circuit of the resonator shown in FIG. 3, it can be confirmed that the inductor 203 connected parallel to the resonator changes the resonance frequency. Therefore, the wirings on the substrate surface were designed such that the inductor components connected serially to all the resonators became approximately the same, and a prototype was made. As a result, regardless of how the resonator was designed, the antiresonance frequency in latticed arms and the resonance frequency in serial arms corresponded approximately to each other, so that a balanced-type surface acoustic wave filter having excellent characteristics could be attained.

EXAMPLE 4

Next, a fourth embodiment of this invention will be explained. In the third embodiment, the wirings on the substrate surface were designed such that the inductor components connected serially to all the resonators became approximately the same. However, when the ratio of equivalent capacity between the resonator 101 in the serial arm and the resonator 102 in the parallel arm was changed, for example, from 1-to-1 to 1-to-2, deterioration of the filter characteristics was also observed, and was probably due to the change of resonance frequency. As expected, this was caused by the inductor components. In the third embodiment, it was appropriate that the inductors were the same, since the equivalent parallel capacity of the resonators was almost the same in both the serial arms and in the lattice arms. However, when the equivalent capacity is different, it is necessary to change the amount of inductors respectively in the serial arm and in the latticed arm.

Figure 9:
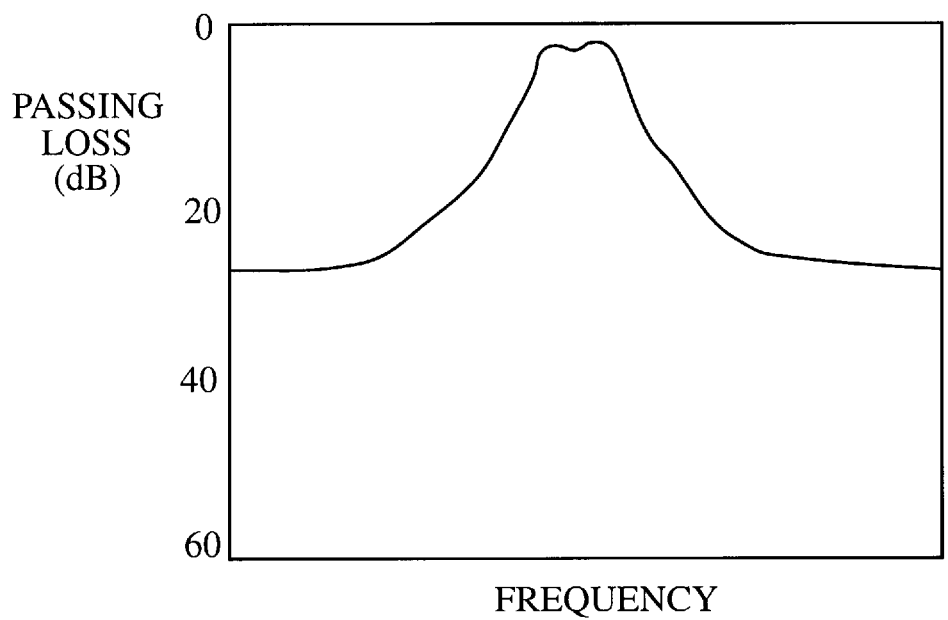
FIG. 9 is a graph showing frequency characteristics of a balanced-type surface acoustic wave filter in a fourth embodiment of this invention.

By taking this aspect into consideration, the ratio of equivalent capacity between the resonator 101 in the serial arm and the resonator 102 in the parallel arm was changed to 2-to-1 (that is, the equivalent parallel capacity of the resonator having higher resonance frequency (resonator 101 in the serial arm) was determined to be greater than the equivalent parallel capacity of the resonator having lower resonance frequency (resonator 102 in the parallel arm) (cf. FIG. 4)). In addition, impedance at connection parts where each resonator in the latticed arms is connected, and the impedance at connection parts to be connected with the serial arms, were determined to be different, and in this way, a balanced-type surface acoustic wave filter was designed. The frequency characteristics are shown in FIG. 9. When compared with the first embodiment, it was confirmed that the out-of-band rejection deteriorated, but the pass band width broadened slightly. Accordingly, even if the ratio of equivalent capacity between the resonator 101 in the serial arm and resonator 102 in the parallel arm was changed from 1-to-1, by setting the impedance at connection parts where each resonator in the latticed arms is connected, and the impedance at connection parts to be connected with the serial arms, to be different, the antiresonance frequency in the latticed arms and the resonance frequency in the serial arms corresponded approximately to each other, so that a balanced-type surface acoustic wave filter having excellent characteristics could be attained.

EXAMPLE 5

Next, a fifth embodiment of this invention will be explained. In this embodiment, the connecting electrode used in the third embodiment was replaced with wires, and wirings on the substrate surface were designed such that inductors entering serially against all the resonators became approximately the same. As a result, the antiresonance frequency in the latticed arms and the resonance frequency in the serial arms corresponded approximately to each other. Thus, as in the third embodiment, when the results were compared with the case without consideration of the inductors, regardless of how the resonator was designed, a balanced-type surface acoustic wave filter having excellent characteristics could be attained.

EXAMPLE 6

Figure 10:
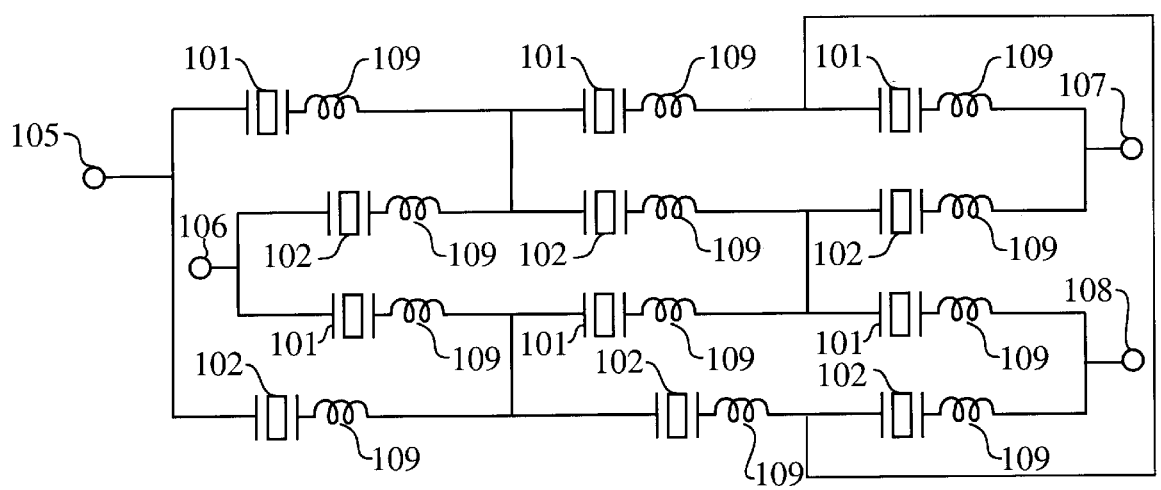
FIG. 10 is a schematic view of a balanced-type surface acoustic wave filter in a sixth embodiment of this invention.
Figure 11:
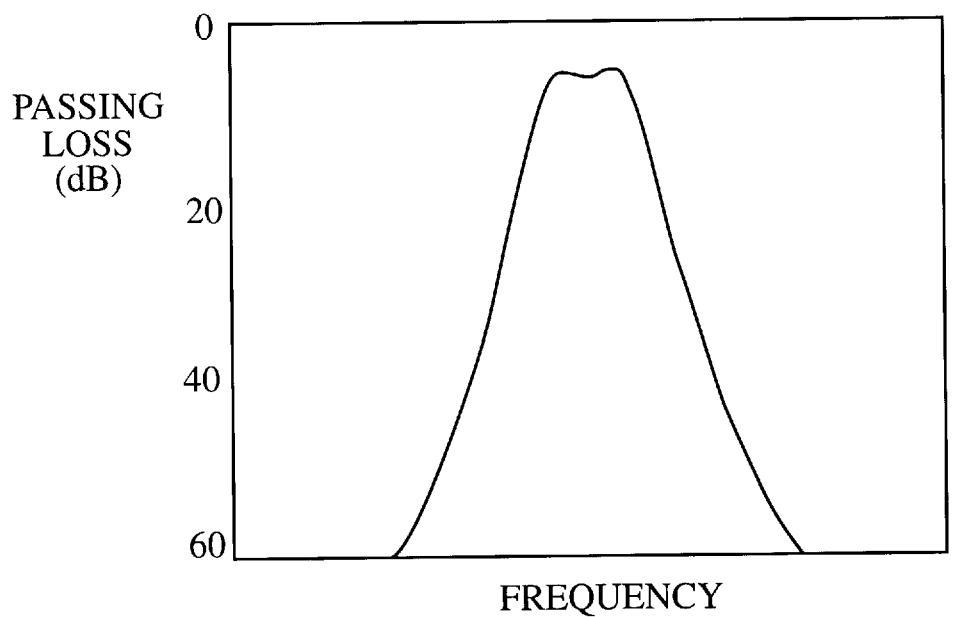
FIG. 11 is a graph showing frequency characteristics of the balanced-type surface acoustic wave filter shown in FIG. 10.

Next, a sixth embodiment of this invention will be explained. FIG. 10 is a schematic view showing the sixth embodiment of a balanced-type surface acoustic wave filter of this invention. In this embodiment, the structure shown in the first embodiment was connected in a three-stage arrangement, which may be used when it is difficult to obtain sufficient out-of-band rejection with either a one-stage or with a two-stage connection. In this way, when it is connected in a three-stage connection, there is no part where wirings cross each other on the substrate surface, so that it is considered advantageous that wire bonding can be facilitated, as this was also the case with the two-stage connection (cf. FIG. 7). Also in this case, as shown in FIG. 11, compared with the first embodiment using a one-stage connection (cf. FIG. 6), a balanced-type surface acoustic wave filter having sufficiently high out-of-band rejection could be attained. In addition, compared with the second embodiment with two-stage connection (cf. FIG. 8), the half-value width became slightly smaller.

Moreover, if the structure shown in the first embodiment were to be connected in a four-stage arrangement or higher, it is difficult to conduct wire bonding, since parts appear once again where wirings cross each other on the substrate surface. Furthermore, if the number of stages is increased too much, the size of the substrate will be larger, so the filter can not be miniaturized.

EXAMPLE 7

Figure 12:
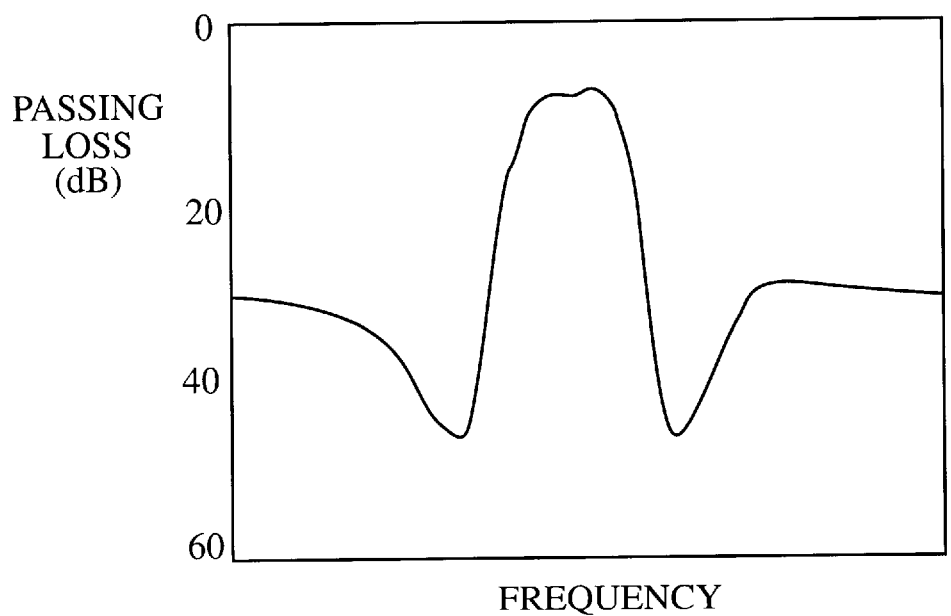
FIG. 12 is a graph showing frequency characteristics of a balanced-type surface acoustic wave filter in a seventh embodiment of this invention.

Next, a seventh embodiment of this invention will be explained. In this embodiment, the ratio of equivalent capacity in the resonators referred to in the fourth embodiment was changed. More specifically, the ratio of equivalent capacity between the resonator 101 in the serial arm and the resonator 102 in the parallel arm was determined to be 2-to-1. In other words, the equivalent parallel capacity of the resonator having the lower resonance frequency (resonator 102 in parallel arm) was determined to be smaller than the equivalent parallel capacity of the resonator having the higher resonance frequency (resonator 101 in serial arm) (cf. FIG. 4). This embodiment creates attenuation poles in the vicinity of pass frequencies of the filter, as shown in FIG. 12, and this is considered especially advantageous when high attenuation is required.

In the above-mentioned embodiments, the antiresonance frequency in the latticed arms and the resonance frequency in the serial arms correspond approximately to each other in substance, but excellent filter characteristics can be also attained when the resonance frequency in the latticed arms and the antiresonance frequency in the serial arms correspond approximately to each other.

EXAMPLE 8

Figure 13:
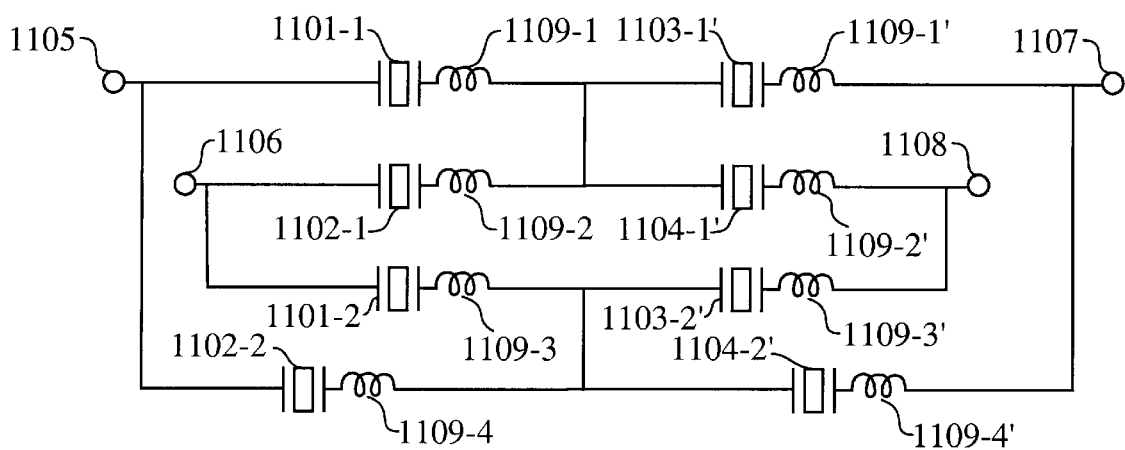
FIG. 13 is a view of an equivalent circuit of the balanced-type surface acoustic wave filter in an eighth embodiment of this invention.

Next, an eighth embodiment of this invention will be explained. FIG. 13 is a view of an equivalent circuit of the balanced-type surface acoustic wave filter in an eighth embodiment of this invention.

A substrate of tantalic acid lithium ($LiTaO_3$) with 36 degrees rotation, Y cut, and X propagation was used, and aluminium was used for the electrodes to form resonators 1101s, 1102s, 1103s and 1104s. As shown in FIG. 13, two resonators 1101–1101-2 in the serial arm and two resonators 1102-1 and 1102-2 in the parallel arm are connected in the form of symmetry and lattice to form a first surface acoustic wave filter. Furthermore, two resonators 1103-1' and 1103-2' in the serial arm and two resonators 1104-1' and 1104-2' in the parallel arm are connected in the form of symmetry and lattice to form a second surface acoustic wave filter. Then, the first and second surface acoustic wave filters are connected in series. In FIG. 13, reference numerals 1105 and 1106 represent input terminals, and 1107 and 1108 represent output terminals. In FIG. 13, 1109s represent inductors which are connected serially to all the resonators. In the first surface acoustic wave filter, the antiresonance frequency of the two resonators 1101s in the serial arms and the resonance frequency of the two resonators 1102s in the parallel arms correspond approximately to each other in substance. Furthermore, in the second surface acoustic wave filter, the antiresonance frequency of the two resonators 1103s in the serial arms and the resonance frequency of the two resonators 1104s in the parallel arms correspond approximately to each other in substance.

Figure 14:
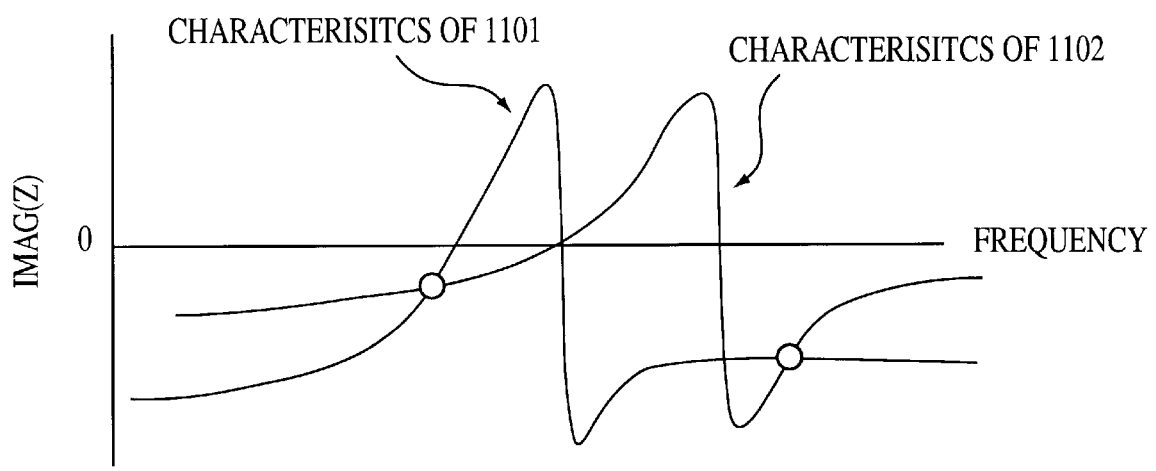
FIG. 14 is a graph showing frequency characteristics of the resonators used for the balanced-type surface acoustic wave filter in an eighth embodiment of this invention.

Frequency characteristics in impedance of the resonators 1101s and 1102s are shown in FIG. 14. Here, although it is explained refering to the first surface acoustic wave filter, the same is applied to the second surface acoustic wave filter. As shown in FIG. 14, the antiresonance frequency of the resonator 1101 in the serial arm and the resonance frequency of the resonator 1102 in the parallel arm correspond approximately to each other in substance. That is, the resonance frequency of the resonator 1101 in the serial arm is set to be lower than the resonance frequency of the resonator 1102 in the parallel arm. At frequencies which the impedance of the resonator 1101 in the serial arm and the impedance of the resonator 1102 in the parallel arm are the same (frequencies represented by two black spots ●), as shown in FIG. 14, attenuation poles appear in transmission characteristics of the filter for the following reason. That is, a symmetrical and latticed circuit is a so-called Wheatstone bridge, where the output of the circuit becomes zero level at the frequency at which the square of the impedance of the resonator 1101 in the serial arm and the square of the impedance of the resonator 1102 in the parallel arm become the same, namely, the impedance of the resonator 1101 in the serial arm and the impedance of the resonator 1102 in the parallel arm become the same.

Attenuation poles appear in transmission characteristics of the filter only when the equivalent parallel capacity of the resonator 1101 in the serial arm is smaller than the equivalent parallel capacity of the resonator 1102 in the parallel arm. The reason is as follows.

Attenuation poles appear in transmission characteristics of the filter, namely, the impedance of the resonator 1101 in the serial arm and the impedance of the resonator 1102 in the parallel arm become the same on condition that an inequality $\mathrm{Imag}(Z_{1101}) < \mathrm{Imag}(Z_{1102})$ is satisfied, except the vicinity of the resonance frequencies and the antiresonance frequencies, when the impedance of the resonator 1101 in the serial arm is $\mathrm{Imag}(Z_{1101})$, the impedance of the resonator 1102 in the parallel arm is $\mathrm{Imag}(Z_{1102})$. That is, since the impedances $\mathrm{Imag}(Z_{1101})$ and $\mathrm{Imag}(Z_{1102})$ of the resonators 1101, 1102 increase monotonically to the resonance frequency, and the resonance frequency of the resonator 1101 in the serial arm is set to be lower than the resonance frequency of the resonator 1102 in the parallel arm, if the inequality $\mathrm{Imag}(Z_{1101}) < \mathrm{Imag}(Z_{1102})$ is satisfied, $\mathrm{Imag}(Z_{1101})$ and $\mathrm{Imag}(Z_{1102})$ become identical at a certain frequency for certain. With the premise, $Z=1/j\omega C$, and thus $\mathrm{Imag}(Z)=-1/\omega C$, in order to have $\mathrm{Imag}(Z_{1101})$ greater than $\mathrm{Imag}(Z_{1102})$, the inequality $C_{1101} < C_{1102}$ ($C_{1101}$ is the equivalent parallel capacity of the resonator 1101 in the serial arm, $C_{1102}$ is the equivalent parallel capacity of the resonator 1102 in the parallel arm) needs to be satisfied.

Figure 15:
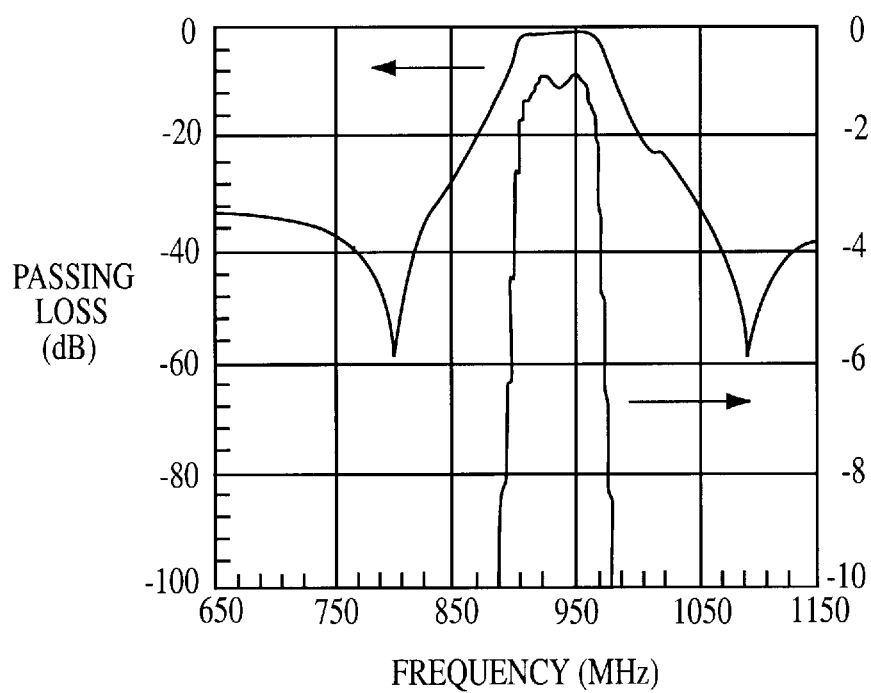
FIG. 15 is a graph showing frequency characteristics of one balanced-type surface acoustic wave filter when the ratio of equivalent parallel capacity is approximately 1.
Figure 16:
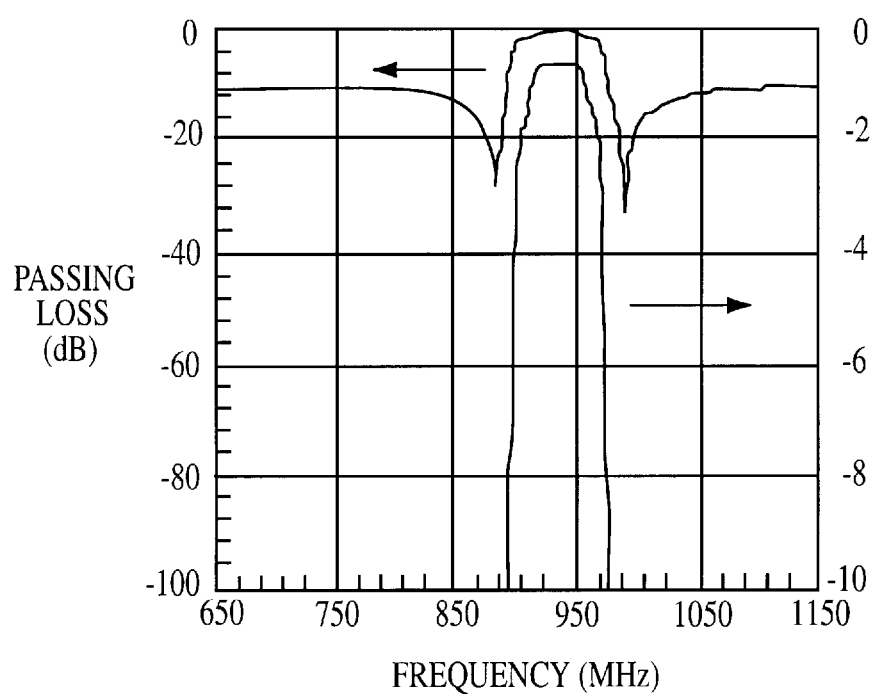
FIG. 16 is a graph showing frequency characteristics of one balanced-type surface acoustic wave filter when the ratio of equivalent parallel capacity is approximately 0.

In this case, if the ratio of equivalent parallel capacity between the resonator 1101 in the serial arm and the resonator 1102 in the parallel arm is approximately 1, as shown in FIG. 15, attenuation poles appear away from the pass band (900 MHz). On the other hand, if the ratio of equivalent parallel capacity between the resonator 1101 in the serial arm and the resonator 1102 in the parallel arm is approximately 0, as shown in FIG. 16, attenuation poles appear in the vicinity of the pass band (900 MHz).

Figure 17:
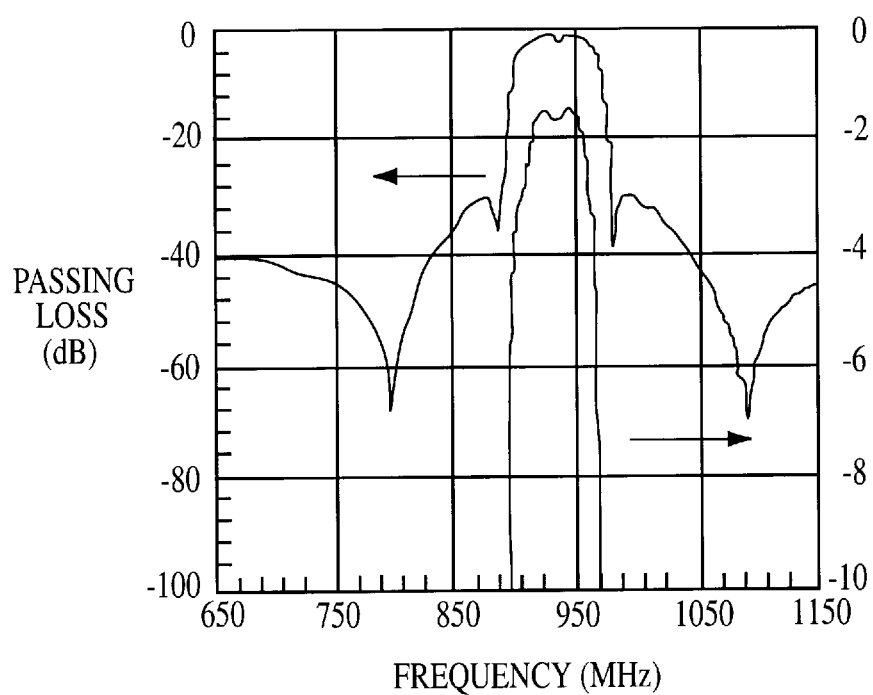
FIG. 17 is a graph showing frequency characteristics of a balanced-type surface acoustic wave filter in an eighth embodiment of this invention.

Two symmetrical and latticed surface acoustic wave filters having different ratios of equivalent parallel capacity as mentioned above are connected in series. As a result, as shown in FIG. 17, attenuation poles appear in the vicinity of the pass band (900 MHz) and away from the pass band (900 MHz). Therefore, according to the eighth embodiment of this invention, a balanced-type surface acoustic wave filter suitable to a balanced-type high frequency circuit where the characteristics of damping the frequency bands both in the vicinity of the pass band and away from the pass band are required, can be obtained.

In this embodiment, although it is explained refering to the 2-stage surface acoustic wave filter, the same is applied to the 3-stage surface acoustic wave filter.

EXAMPLE 9

Next, a ninth embodiment of this invention will be explained. In this embodiment, the frequency characteristics of passing loss in the balanced-type surface acoustic wave filter is improved by controling input-output impedance of the symmetrical and latticed balanced-type surface acoustic wave filter.

Figure 18:
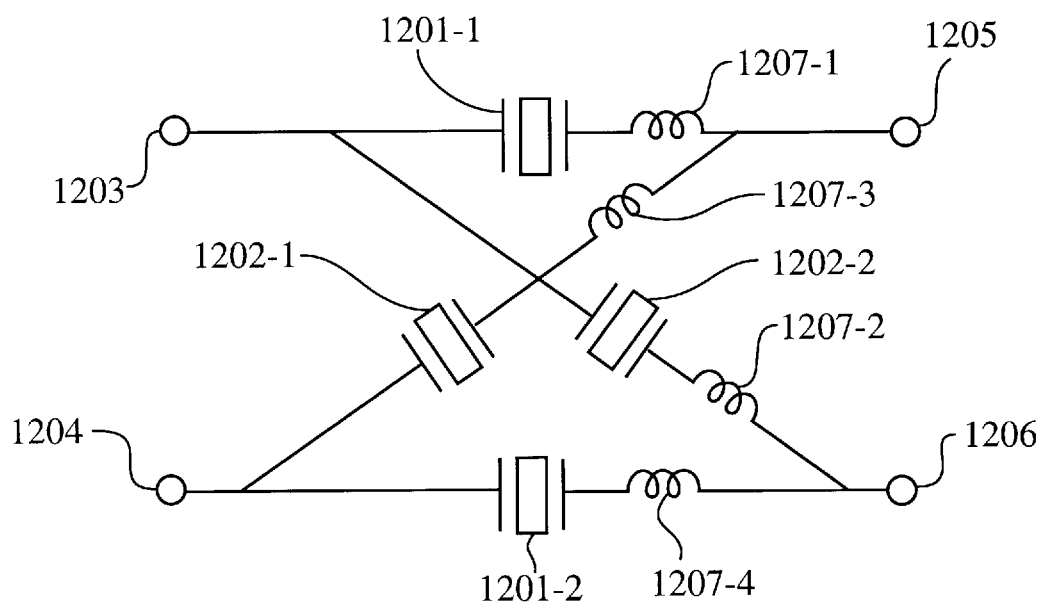
FIG. 18 is a view of an equivalent circuit of the balanced-type surface acoustic wave filter in a ninth embodiment of this invention.

FIG. 18 is a view of an equivalent circuit of the balanced-type surface acoustic wave filter in a ninth embodiment of this invention. In the same way as above-mentioned eighth embodiment of this invention, a substrate of tantalic acid lithium ($LiTaO_3$) with 36 degrees rotation, Y cut, and X propagation was used, and aluminium was used for the electrodes to form resonators 1201, 1202. As shown in FIG. 18, two resonators 1201-1 and 1201-2 in the serial arm and two resonators 1202-1 and 1202-2 in the parallel arm are connected in the form of symmetry and lattice to form a balanced-type surface acoustic wave filter. In FIG. 18, reference numerals 1203 and 1204 represent input terminals, and 1205 and 1206 represent output terminals. In FIG. 18, 1207s represent inductors which are connected serially to all the resonators. Here, the antiresonance frequency of the two resonators 1201-1 and 1201-2 in the serial arms and the resonance frequency of the two resonators 1202-1 and 1202-2 in the parallel arms correspond approximately to each other in substance. Furthermore, the equivalent parallel capacity of the resonator 1201 in the serial arm is set to be lower than the equivalent parallel capacity of the resonator 1202 in the parallel arm.

When a geometric mean of the equivalent parallel capacity of the resonator 1201 in the serial arm and the equivalent parallel capacity of the resonator 1202 in the parallel arm is C, the input-output impedance of the balanced-type surface acoustic wave filter is Z, the passing center frequency of the balance-type surface acoustic wave filter is F, and a correction factor is K, it is defined that the equesion $ZK=\frac{1}{2}\pi FC$ is satisfied.

Figure 19:
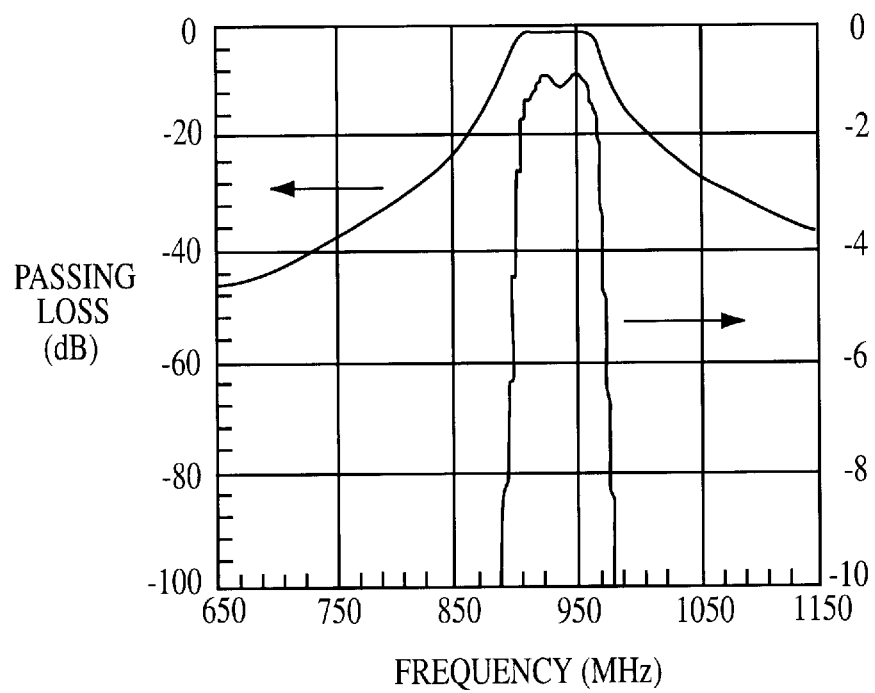
FIG. 19 is a graph showing frequency characteristics of passing loss in the balanced-type surface acoustic wave filter shown in FIG. 18 with the correction factor K=1.

The frequency characteristics of passing loss in the above-mentioned balanced-type surface acoustic wave filter with the correction factor K=1 is shown in FIG. 19. As shown in FIG. 19, the frequency characteristics of passing loss in this case is excellent.

Figure 20:
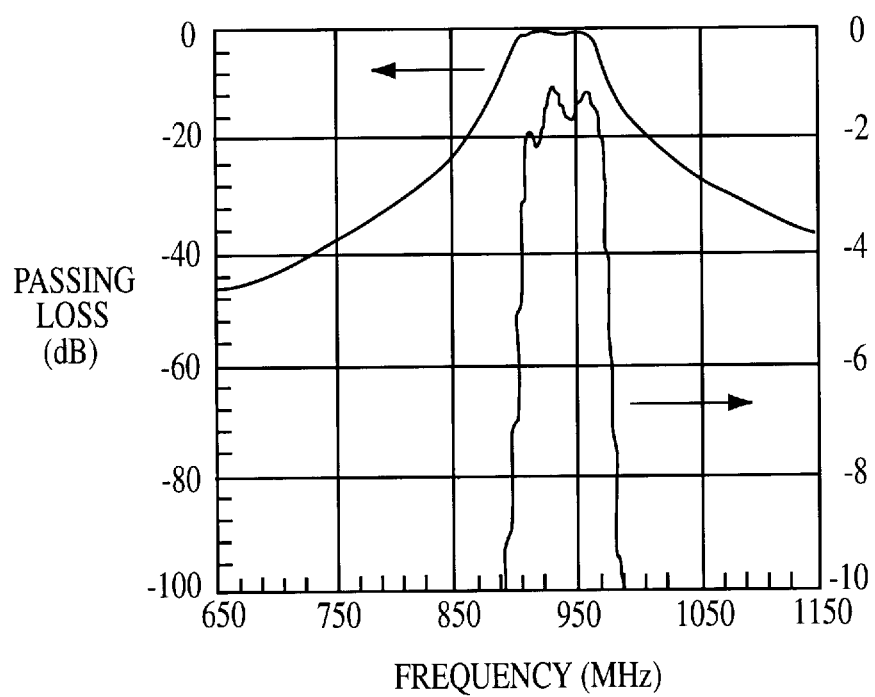
FIG. 20 is a graph showing frequency characteristics of passing loss in the balanced-type surface acoustic wave filter shown in FIG. 18 with the correction factor K=0.6.
Figure 21:
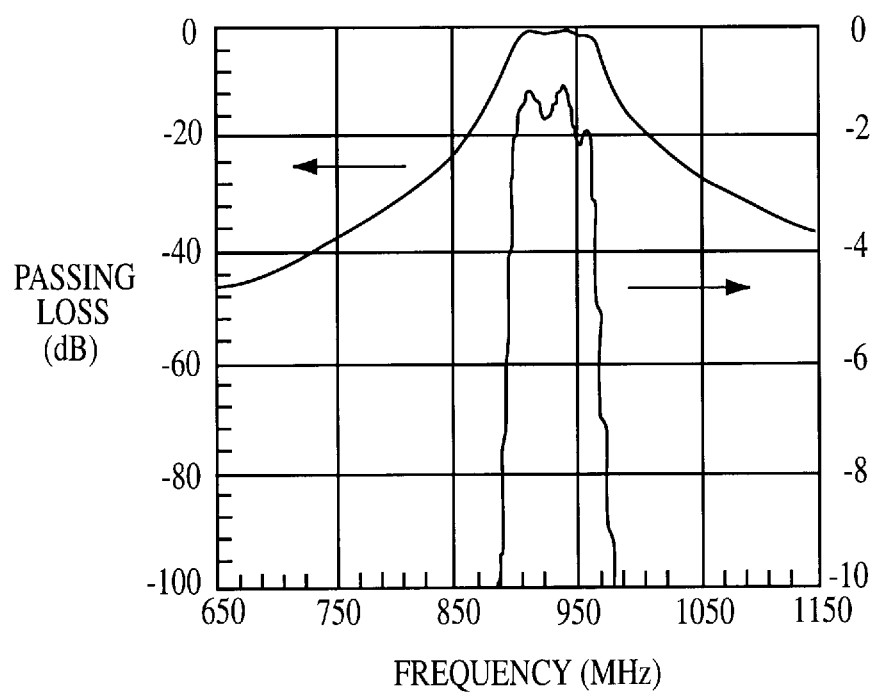
FIG. 21 is a graph showing frequency characteristics of passing loss in the balanced-type surface acoustic wave filter shown in FIG. 18 with the correction factor K=1.8.
Figure 22:
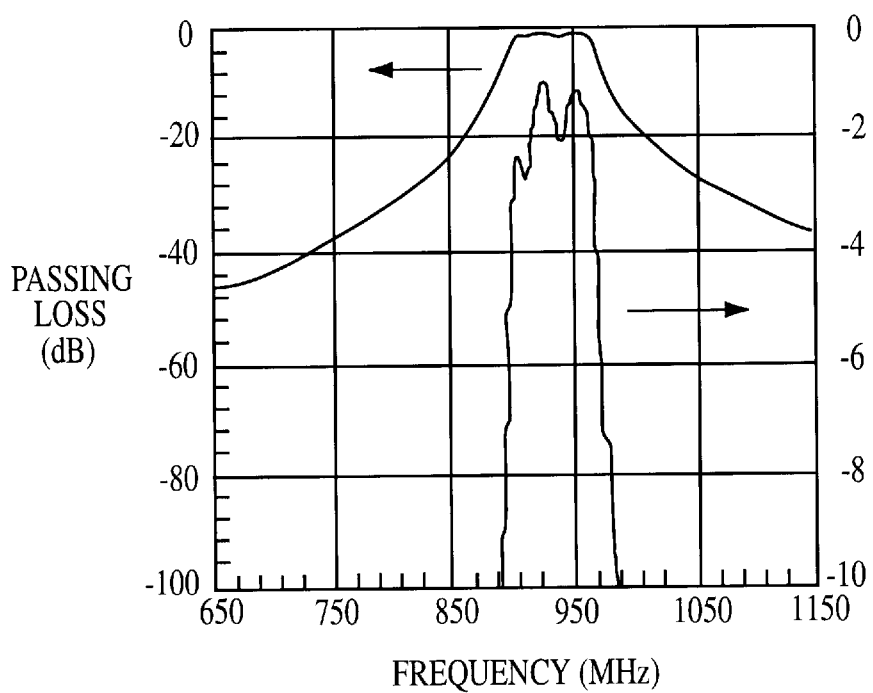
FIG. 22 is a graph showing frequency characteristics of passing loss in the balanced-type surface acoustic wave filter shown in FIG. 18 with the correction factor K=0.5.
Figure 23:
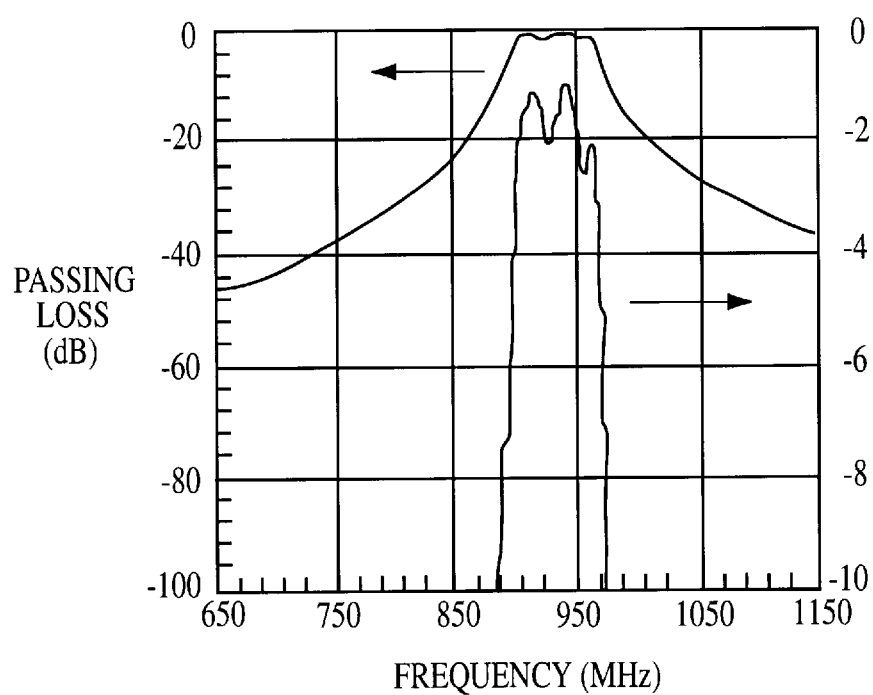
FIG. 23 is a graph showing frequency characteristics of passing loss in the balanced-type surface acoustic wave filter shown in FIG. 18 with the correction factor K=2.2.

The frequency characteristics of passing loss in the above-mentioned balanced-type surface acoustic wave filter with the correction factor K=0.6 is shown in FIG. 20, and the frequency characteristics of passing loss in the above-mentioned balanced-type surface acoustic wave filter with the correction factor K=1.8 is shown in FIG. 21. Furthermore, the frequency characteristics of passing loss in the above-mentioned balance-type surface acoustic wave filter with the correction factor K=0.5 is shown in FIG. 22, and the frequency characteristics of passing loss in the above-mentioned balanced-type surface acoustic wave filter with the correction factor K=2.2 is shown in FIG. 23. Here, a balanced-type surface acoustic wave filter having the pass band of 900 MHz is used. As shown in FIGS. 20 and 22, when a correction factor K is smaller than 0.6, ripples in the pass band become conspicuous, and a large ripple appears at a frequency lower than the pass band. As shown in FIGS. 21 and 23, when a correction factor is larger than 1.8, ripples in the pass band become conspicuous, and a large ripple appears at a frequency higher than the pass band. Accordingly, ripples in the pass band can be maintained at a low level with a correction factor of $0.6 \leq K \leq 1.8$.

As it is not necessary that the input-output impedance of a balanced-type surface acoustic wave filter and the input-output impedance of a high frequency circuit correspond to each other, in the ninth embodiment of this invention, the frequency characteristics of passing loss in the balanced-type surface acoustic wave filter can be improved by introducing the correction factor K, and controlling input-output impedance of the balanced-type surface acoustic wave filter. For example, even when the balanced-type surface acoustic wave filter having input-output impedance of 40 Ω is connected to high frequency circuit having input-output impedance 50 Ω, the required characteristics can be satisfied. However, considering signal reflection, deterioration of characteristics, etc., which are generated by the difference between the input-output impedance of a balanced-type surface acoustic wave filter and the input-output impedance of a high frequency circuit, it is necessary that the correction factor K is in appropriate range. When a correction factor K is larger than 0.6, and smaller than 1.8 as mentioned above, signal reflection, deterioration of characteristics, etc., which are generated by the difference between the input-output impedance of a balanced-type surface acoustic wave filter and the input-output impedance of a high frequency circuit, can be suppressed. As a result, the balanced-type surface acoustic wave filter having excellent characteristics can be obtained.

As mentioned above, according to the ninth embodiment of this invention, ripples in the pass band can be maintained at a low level, and signal reflection, deterioration of characteristics, etc. can be suppressed. As a result, since input-output impedance of a balanced-type surface acoustic wave filter can be changed appropriately with adoption of a balance-type circuit, the balanced-type surface acoustic wave filter suitable to a balanced-type high frequency circuit can be obtained.

EXAMPLE 10

Next, a tenth embodiment of this invention will be explained. In this embodiment, two surface acoustic wave filters as mentioned in the ninth embodiment of this invention are connected in series. Here, two filters have different ratio of equivalent parallel capacity of the resonators 1201 in the serial arm and equivalent parallel capacity of the resonators 1202 in the parallel arm.

Figure 24:
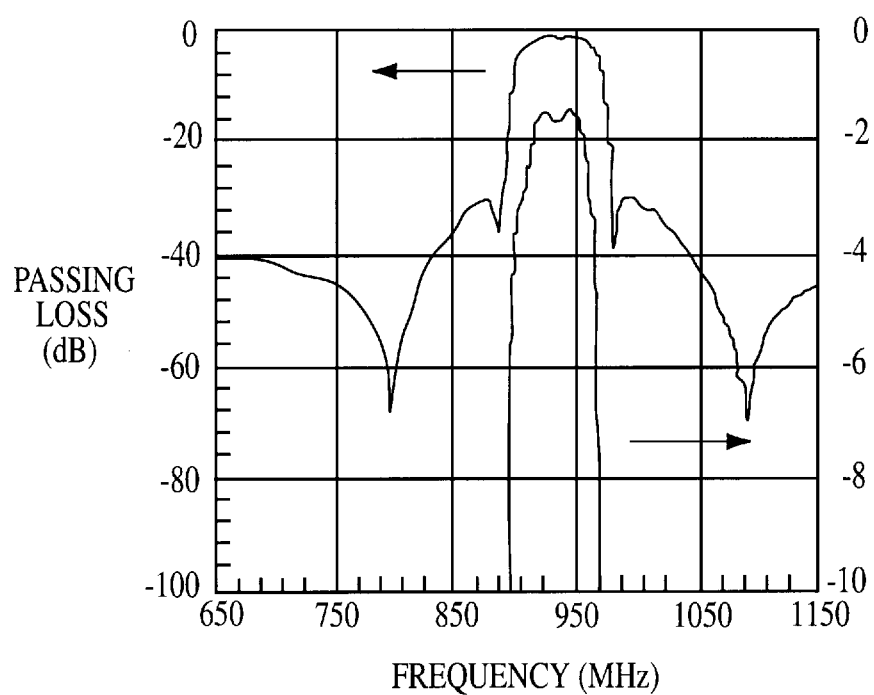
FIG. 24 is a graph showing frequency characteristics of passing loss in the balanced-type surface acoustic wave filter in a tenth embodiment of this invention.

The frequency characteristics of passing loss in the above-mentioned balanced-type surface acoustic wave filter is shown in FIG. 24. As shown in FIG. 24, a balanced-type surface acoustic wave filter having a high attenuation over wide-ranging frequencies can be obtained.

In this embodiment, although it is explained refering to the 2-stage surface acoustic wave filter, the same is applied to the 3-stage surface acoustic wave filter.

In addition, although the above-mentioned embodiments made use of tantalic acid lithium for substrates, it is not necessarily limited to this material only. A substrate having substantially the same piezoelectric properties, for example, a quartz crystal substrate or a substrate of lithium niobate ($LiNbO_3$) may be used as well. In other words, by using a piezoelectric substance, a balanced-type surface acoustic wave filter having substantially the same excellent characteristics can be attained.

Moreover, although the above-mentioned embodiments made use of aluminium for electrodes, it is not necessarily limited to this material only. From the viewpoint of durability, by using aluminium mixed with copper or titanium, a balanced-type surface acoustic wave filter having substantially the same excellent characteristics can be attained.

The invention may be embodied in other forms without departing from the spirit or essential characteristics thereof. The embodiments disclosed in this application are to be considered in all respects as illustrative and not as restrictive. The scope of the invention is indicated by the appended claims rather than by the foregoing description, and all changes which come within the meaning and range of equivalency of the claims are intended to be embraced therein.

What is claimed is:

1. A balanced-type surface acoustic wave filter comprising:
    a plurality of symmetrical and latticed circuits connected in series, each of said symmetrical and latticed circuits comprises four arms which are connected so that two of said four arms serve as serial arms and the other two arms serve as latticed arms, and four surface acoustic wave resonators disposed so that said resonators are respectively arranged in said serial arms and said latticed arms;
    a plurality of connectors for connecting each of said four surface acoustic wave resonators,
    wherein each of said plurality of connectors has substantially the same impedance; and
    means for adjusting resonant frequencies in said latticed arms and said serial arms to satisfy at least one of the following conditions;
        (i) an antiresonance frequency in said latticed arms and a resonance frequency in said serial arms are substantially equal to each other, and
        (ii) a resonance frequency in said latticed arms and an antiresonance frequency in said serial arms are substantially equal to each other,
    wherein a first resonator of said four surface acoustic wave resonators has a resonance frequency which is lower than a resonance frequency of a second resonator of said four surface acoustic wave resonators, and wherein an equivalent parallel capacity of said first resonator is smaller than an equivalent parallel capacity of said second resonator.

2. The balanced-type surface acoustic wave filter according to claim 1, wherein each of said connectors comprises at least one of (i) a connecting electrode formed on the surface of a substrate on which said four surface acoustic wave resonators are formed, and (ii) a wire used for connecting to an external circuit.

3. The balanced-type surface acoustic wave filter according to claim 1, further comprising:
    a plurality of first connectors for connecting each of said surface acoustic wave resonators located in the latticed arm; and
    a plurality of second connectors for connecting each of said surface acoustic wave resonators located in the serial arm,
    wherein an impedance at said first connectors differs from an impedance at said second connectors.

4. The balanced-type surface acoustic wave filter according to claim 3, wherein each of said first and second connectors comprises at least one of (i) a connecting electrode formed on the surface of a substrate on which said four surface acoustic wave resonators are formed, and (ii) a wire used for connecting to an external circuit.

5. A balanced-type surface acoustic wave filter comprising:
    a symmetrical and latticed circuit, said symmetrical and latticed circuit comprises first and second surface acoustic wave resonators, wherein an antiresonance frequency in said first surface acoustic wave resonators and a resonance frequency in said second surface acoustic wave resonators are substantially equal to each other;
    an equivalent parallel capacity of said first surface acoustic wave resonators is smaller than an equivalent parallel capacity of said second surface acoustic wave resonators; and
    a geometric mean of the equivalent parallel capacity of said first surface acoustic wave resonators and the equivalent parallel capacity of said second surface acoustic wave resonators is C, an input-output impedance of said symmetrical and latticed circuit is Z, a passing center frequency of said symmetrical and latticed circuit is F, a correction factor is K, and an equation $ZK = \frac{1}{2}\pi FC$ is satisfied where $0.6 \leq K < 1.8$.

6. The balanced-type surface acoustic wave filter according to claim 5, further comprising:

a plurality of said asymmetrical and latticed circuits connected in series, whereby said symmetrical and latticed circuits have different ratio in terms of equivalent parallel capacities of said first surface acoustic wave resonators to said second surface acoustic wave resonators.

7. A balanced-type surface acoustic wave filter comprising:

a plurality of symmetrical and latticed circuits connected in series, wherein each of said symmetrical and latticed circuits comprises first and second surface acoustic wave resonators, wherein an antiresonance frequency in said first surface acoustic wave resonators and a resonance frequency in said second surface acoustic wave resonators are substantially equal to each other; and an equivalent parallel capacity of said first surface acoustic wave resonators is smaller than an equivalent parallel capacity of said second surface acoustic wave resonators, and said symmetrical and latticed circuits have different ratio in terms of equivalent parallel capacities of said first surface acoustic wave resonators to said second surface acoustic wave resonators.

* * * * *